(12) United States Patent  (10) Patent No.: US 7,705,757 B2
Healy et al.  (45) Date of Patent: Apr. 27, 2010

(54) GAIN MATCHING METHOD AND SYSTEM FOR SINGLE BIT GAIN RANGING ANALOG-TO-DIGITAL CONVERTER

(75) Inventors: John Healy, Coolcotts (IE); Colin Lyden, Baltimore (IE)

(73) Assignee: Analog Devices, Inc., Norwood, MA (US)

( * ) Notice: Subject to any disclaimer, the term of this patent is extended or adjusted under 35 U.S.C. 154(b) by 13 days.

(21) Appl. No.: 11/998,618

(22) Filed: Nov. 30, 2007

(65) Prior Publication Data
US 2009/0140897 A1 Jun. 4, 2009

(51) Int. Cl.
*H03M 3/00* (2006.01)

(52) U.S. Cl. .................. 341/143; 341/118; 341/120; 341/155; 341/172

(58) Field of Classification Search ................. 341/143, 341/155, 172, 118–122
See application file for complete search history.

(56) References Cited

U.S. PATENT DOCUMENTS

| | | | |
|---|---|---|---|
| 5,221,926 A | 6/1993 | Jackson | |
| 5,406,283 A | 4/1995 | Leung | |
| 6,304,608 B1 * | 10/2001 | Chen et al. | 375/252 |
| 6,348,884 B1 | 2/2002 | Steengaard-Madsen | |
| 6,380,874 B1 * | 4/2002 | Knudsen | 341/118 |
| 6,456,218 B1 * | 9/2002 | Dedic et al. | 341/144 |
| 6,522,277 B2 * | 2/2003 | Fujimori et al. | 341/144 |
| 6,614,377 B1 * | 9/2003 | Adams et al. | 341/144 |
| 6,674,381 B1 * | 1/2004 | Gomez et al. | 341/143 |
| 6,697,003 B1 * | 2/2004 | Chen | 341/143 |
| 6,720,903 B2 * | 4/2004 | Confalonieri et al. | 341/172 |
| 6,873,276 B2 * | 3/2005 | Yang et al. | 341/143 |
| 6,940,436 B2 * | 9/2005 | Hezar et al. | 341/143 |
| 6,956,514 B1 * | 10/2005 | Melanson et al. | 341/143 |
| 7,079,063 B1 | 7/2006 | Nguyen et al. | |
| 7,167,119 B1 * | 1/2007 | Lei et al. | 341/143 |
| 7,227,481 B2 * | 6/2007 | del Mar Chamarro Marti et al. | 341/143 |
| 7,391,351 B2 * | 6/2008 | Pertijs et al. | 341/143 |
| 7,405,687 B2 * | 7/2008 | Mitteregger et al. | 341/143 |

FOREIGN PATENT DOCUMENTS

WO WO2005/117269 12/2005

* cited by examiner

*Primary Examiner*—Linh V Nguyen

(57) ABSTRACT

A gain matching method for a single bit gain ranging analog to digital converter including selecting, in response to a gain setting, a number of gain elements to be enabled in a multi-element gain controlled array interconnected between an analog input and an analog to digital converter, and patterning the enablement of the selected number of gain elements among the gain elements for matching the gain of the analog to digital converter for a range of gain settings of the converter to reduce in-band gain error due to gain element mismatch.

25 Claims, 7 Drawing Sheets

GAIN MATCHING METHOD AND SYSTEM FOR SINGLE BIT GAIN RANGING ANALOG-TO-DIGITAL CONVERTER

FIELD OF THE INVENTION

This invention relates to an improved gain matching method and system for a single bit gain ranging analog to digital converter.

BACKGROUND OF THE INVENTION

Conventional charge balance converter ADC's provide a single bit output with gain ranging. In order to achieve gain matching the single bit quantizer output is submitted to a gain multiplier which sets the gain range and delivers it to a thermometer decoder whose output then operates the feedback elements, e.g. capacitors. ΣΔ capacitance-to-digital converters (CDC) are a type sigma delta modulator ADC with a modification to convert an unknown capacitance e.g. a capacitance pressure sensor output to a digital output code. Aside from this modification, they share typical characteristics of sigma delta modulators e.g. over sampling, negative feedback, quantization noise shaping etc. CDC's can achieve multiple input gain ranges by selecting a subset of multiple feedback unit elements from a larger array for the duration of a conversion. These unit elements have minor mismatching between them due to process manufacturing imperfections. This mismatch gives rise to gain errors across the input ranges of the CDC, as the user changes input range. Gain error can be reduced by calibrating for each input range with a known calibration standard value during final test. For multiple input gain ranges, multiple standard values are required, increasing the cost of final test both in time to calibrate across all ranges and increased complexity/hardware. Also, the gain calibration does not hold for gain drifts with time and temperature.

Another type of charge balance converter ADC, provides a multi-bit output directly to a thermometer decoder, without any independent gain setting e.g., U.S. Pat. No. 5,406,283, entitled MULTIBIT OVERSAMPLED DAC WITH DYNAMIC ELEMENT MATCHING, Leung et al., Apr. 11, 1995 hereby incorporated in its entirety by this reference. The decoder output is delivered to a dynamic element matching algorithm (DEM) which patterns the switching signals to the feedback elements to improve linearity by minimizing the in-band errors embodied by the mismatch of these elements.

BRIEF SUMMARY OF THE INVENTION

It is therefore an object of this invention to provide an improved gain matching system and method for a single bit gain ranging analog to digital converter.

It is a further object of this invention to provide such an improved gain matching system and method for a single bit gain ranging analog to digital converter with more accurate gain ranging.

It is a further object of this invention to provide such an improved gain matching system and method for a single bit gain ranging analog to digital converter which avoids the time and hardware costs required for calibration whether in factory or field.

It is a further object of this invention to provide such an improved gain matching system and method for a single bit gain ranging analog to digital converter which avoids drift error due to time and temperature.

It is a further object of this invention to provide such an improved gain matching system and method for a single bit gain ranging analog to digital converter which operates continuously and maintains calibration over temperature and time.

The invention results from the realization that an improved gain matching system and method for a single bit analog to digital converter which provides more accurate gain ranging without calibration and avoids drift error due to time and temperature can be achieved by selecting, in response to a gain setting, a number of gain elements to be enabled in a multi-element gain controlled array interconnected between an analog input and an analog to digital converter; and patterning the enablement of the selected number of gain elements among the gain elements for matching the gain of the analog to digital converter for a range of gain settings of the converter to reduce in-band gain error due to gain element mismatch.

The subject invention, however, in other embodiments, need not achieve all these objectives and the claims hereof should not be limited to structures or methods capable of achieving these objectives.

This invention features a single bit gain ranging analog to digital converter with gain matching system including a multi-element gain controlled array having a plurality of gain controlled elements, a summing circuit responsive to an analog input and the output of the multi-element gain controlled array for defining a difference signal, and a quantizer for digitizing the difference signal. A gain mismatch shaping circuit is responsive to the digitized difference signal and a gain setting to select a number of the gain elements to be enabled and to pattern the enablement of the selected number of gain elements among the gain elements for matching the gain of the analog to digital converter for a range of gain settings of the converter to reduce in-band gain error due to gain element mismatch.

In a preferred embodiment the gain controlled elements may be nominally equal. The gain controlled elements may be capacitors, resistors or current sources. The quantizer may provide a digitized difference signal with both positive and negative values. The gain mismatch shaping circuit may include a gain multiplier circuit responsive to the digitized difference signal and a gain setting to provide a gain command. The gain mismatch shaping circuit may include a decoder responsive to the gain command for selecting a number of the gain elements to be enabled. The gain mismatch shaping circuit may include a dynamic element matching system for patterning the enablement of the selected number of gain elements among all of the gain elements for matching the gain of the analog to digital converter for a range of gain settings of the converter with reduced in-band gain error due to gain element mismatch. The decoder may be a thermometer decoder. The quantizer may include a loop filter for shaping the difference signal. The dynamic element matching system may include a memory for each quantizer output value. The dynamic element matching system may be configured to set the number of elements in the array; set the gain; initialize pointer position; enable a number of elements corresponding to the set gain and identified by the pointer; increment the pointer by the number of elements and save the pointer position.

This invention also features a single bit gain ranging analog to digital converter with gain matching system including a multi-element gain controlled array having a plurality of gain controlled elements disposed between an analog input and an analog to digital converter and a gain mismatch shaping circuit responsive to a gain setting for selecting a number of the gain elements to be enabled and patterning the enablement of the selected number of gain elements among the gain elements for matching the gain of the analog to digital converter for a range of gain settings of the converter to reduce in-band gain error due to gain element mismatch.

In a preferred embodiment the gain controlled elements may be nominally equal. The gain controlled elements may be capacitors, resistors or current sources. The analog to digital converter may include a quantizer that produces an output with two values. The gain mismatch shaping circuit may include a gain setting circuit to provide a gain command. The gain mismatch shaping circuit may include a decoder responsive to the gain command for selecting a number of the gain elements to be enabled. The gain mismatch shaping circuit may include a dynamic element matching system for patterning the enablement of the selected number of gain elements among all of the gain elements for matching the gain of the analog to digital converter for a range of gain settings of the converter with reduced in-band gain error due to gain element mismatch. The quantizer may include an input loop filter for shaping the difference signal. The dynamic element matching system may include a memory for each quantizer output value. The dynamic element matching system may be configured to set the number of elements in the array; set the gain; initialize pointer position; enable a number of elements corresponding to the set gain and identified by the pointer; increment the pointer by the number of elements; and save the pointer position.

This invention also features a gain matching method for a single bit gain ranging analog to digital converter including summing an analog input and the output of a multi-element gain controlled array including a plurality of gain controlled elements to obtain a difference signal, quantizing the difference signal, selecting, in response to the quantized difference signal and gain setting, a number of gain elements to be enabled, and patterning the enablement of the selected number of gain elements among the gain elements for matching the gain of the analog to digital converter for a range of gain settings of the converter to reduce in-band gain error due to gain element mismatch.

In a preferred embodiment patterning may include setting the number of elements in the array; setting the gain; initializing the pointer position; enabling a number of elements corresponding to the set gain and identified by the pointer; incrementing the pointer by the number of elements; and saving the pointer position This invention also features a gain matching method for a single bit gain ranging analog to digital converter including selecting, in response to a gain setting, a number of gain elements to be enabled in a multi-element gain controlled array interconnected between an analog input and an analog to digital converter, and patterning the enablement of the selected number of gain elements among the gain elements for matching the gain of the analog to digital converter for a range of gain settings of the converter to reduce in-band gain error due to gain element mismatch.

In a preferred embodiment patterning may include setting the number of elements in the array; setting the gain; initializing the pointer position; enabling a number of elements corresponding to the set gain and identified by the pointer; incrementing the pointer by the number of elements; and saving the pointer position.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
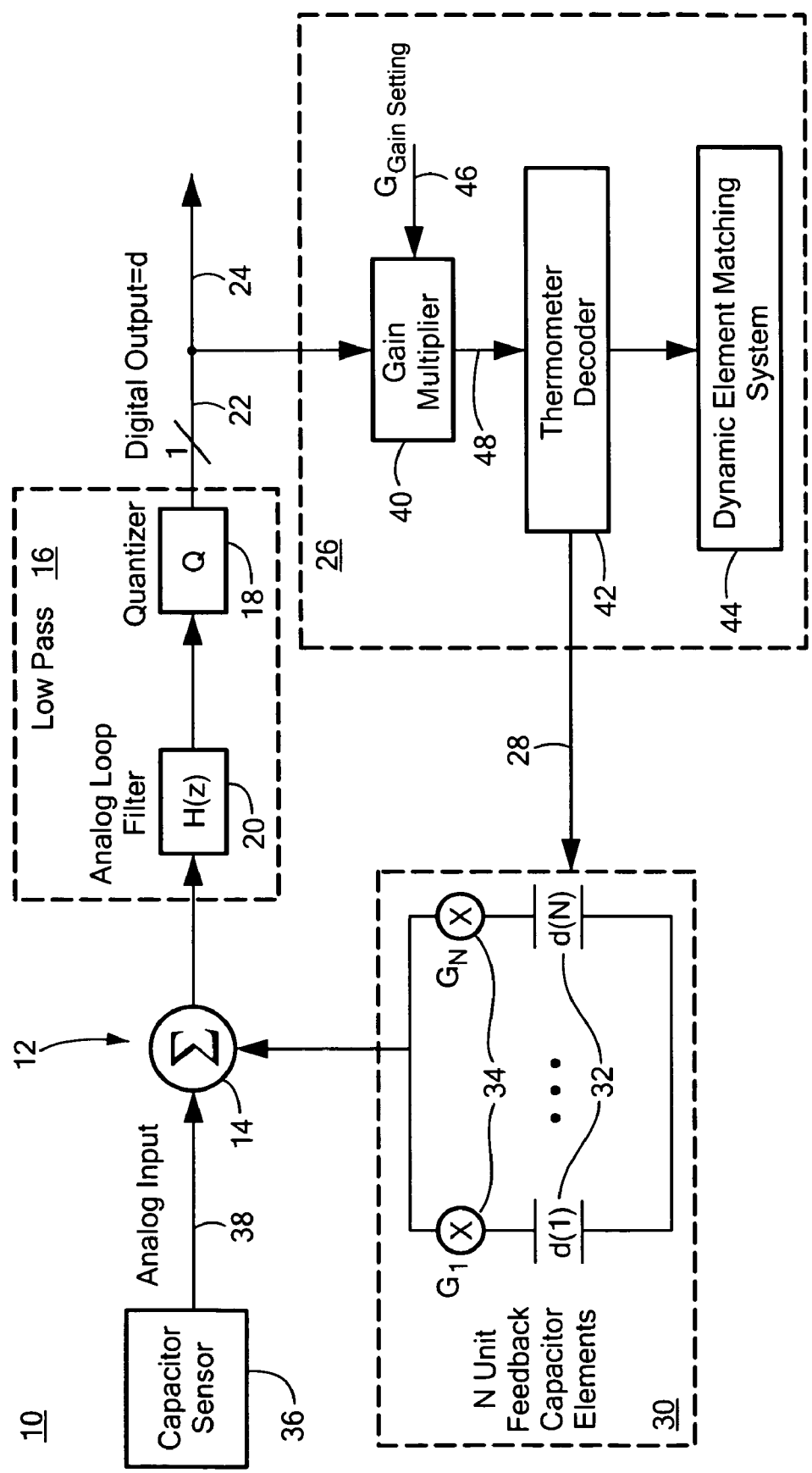
FIG. 1 is a schematic block diagram of a single bit gain ranging analog to digital converter with gain matching according to this invention, with the multi-element gain controlled array in a feedback loop of the converter.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a gain matching system 10 for a single bit gain ranging analog to digital converter. Analog to digital converter 12 includes summing circuit 14 and a quantizer circuit 16 which includes quantizer 18 and analog loop filter 20. Since converter 12 is a single bit analog to digital converter the output of quantizer 18 will have only one of two values at its output: one or zero or plus one and minus one. A number of the quantizer output bits on line 22 are averaged, for example in quantities of a 1,000, to provide the digital output 24. A quantizer output is delivered to mismatch shaping gain circuit 26 whose output at 28 is in turn used to drive a multi-element gain controlled array 30 comprising a plurality, N, of gain controlled elements. In this case the N elements 32 are capacitors and they are controlled by a like number of switches 34 which are operated by mismatch shaping gain circuit 26. Elements 32 may also be resistors or current sources.

In operation an analog input such as from a capacitor sensor 36 may be provided as the analog input 38 to summing circuit 14. Summing circuit 14 combines e.g. compares, subtracts the output of multi-element gain controller 30 and analog input 38 to provide a difference signal to quantizer 18 through analog loop filter 20. Quantizer 18 provides an output of one or zero (plus one, minus one) to mismatch shaping gain circuit 26 which includes a gain multiplier circuit 40, decoder such as thermometer decoder 42 and a dynamic element matching (DEM) system 44. Gain multiplier 40 employs the gain setting, G, on line 46 along with the quantizer bit on line 22 to provide a gain command on line 49 to decoder 42. For example, if the gain setting, G, equals four indicating that four of the N elements 32 should be employed, that information plus the value of the quantizer output one or zero is provided to decoder 42 which then provides an output such as a 16 bit output to select the proper number of capacitor elements 32 in array 30. That is, when quantizer 18 output is a one, and the gain setting G is four, gain multiplier 40 will provide a plus four indication to decoder 42. When quantizer output 18 is zero, with G still set to four, the output to decoder 42 will be a minus 4. DEM system 44 responds to the output of decoder 42 to enable the four capacitor elements in a particular pattern, for example, a round robin pattern. This is done in order to improve the accuracy of the system. This is so because while the N elements 32 are nominally equal in practice they can never all be equal, so rather than calibrate each of them with respect to a reference and perhaps lose the calibration as time and temperature vary this invention contemplates using each of the capacitor elements 32 equally over a period of time so that any inaccuracies in their precision will be averaged over many, many cycles of operation, thereby reducing the in-band gain error due to the elements mismatch.

Figure 2:
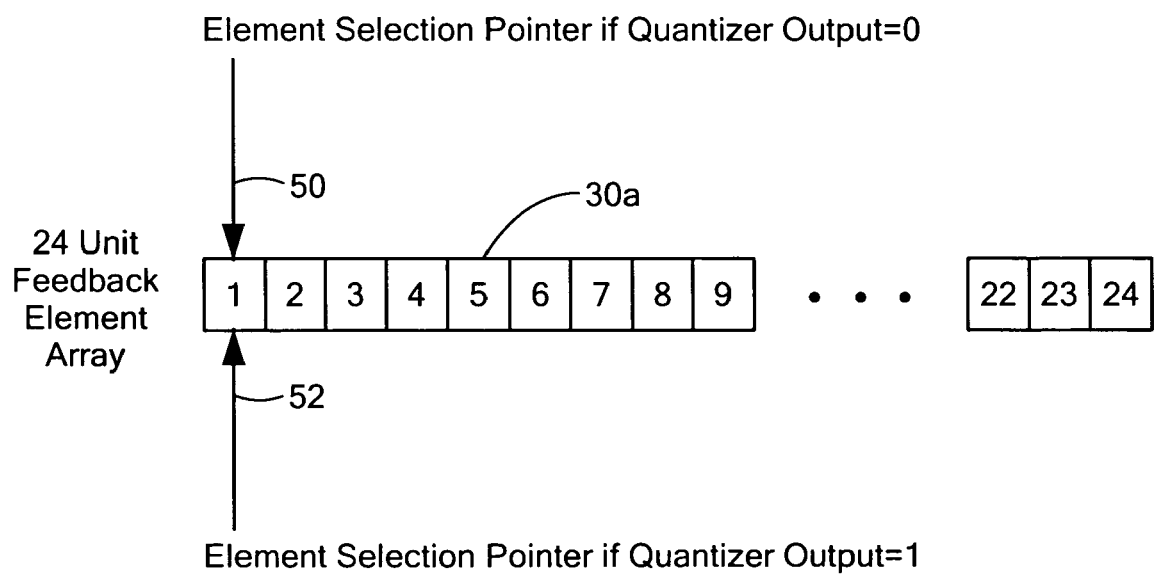
FIG. 2 is a diagrammatic illustration of the multi-pointer memory addressing array according to this invention.

Because quantizer 18 is a single bit quantizer and provides only two values, DEM 44 requires a corresponding two pointers in order to keep track of which elements of the array were used in the last cycle and which should be used in the next cycle to keep the succession going thereby maintaining a uniform use of N elements 32. One pointer 50, FIG. 2, is the pointer that keeps track of the last element used or the next element to be used when the output of quantizer 18 is a zero (or a minus one). Pointer 52 keeps track of the last one of elements 32 that was used or the next one to be used when the quantizer 18 output is one (or plus one). In this case the element array 30a is shown as having 24 gain controlled elements, that is, N=24, but any number may be used.

Figure 3:
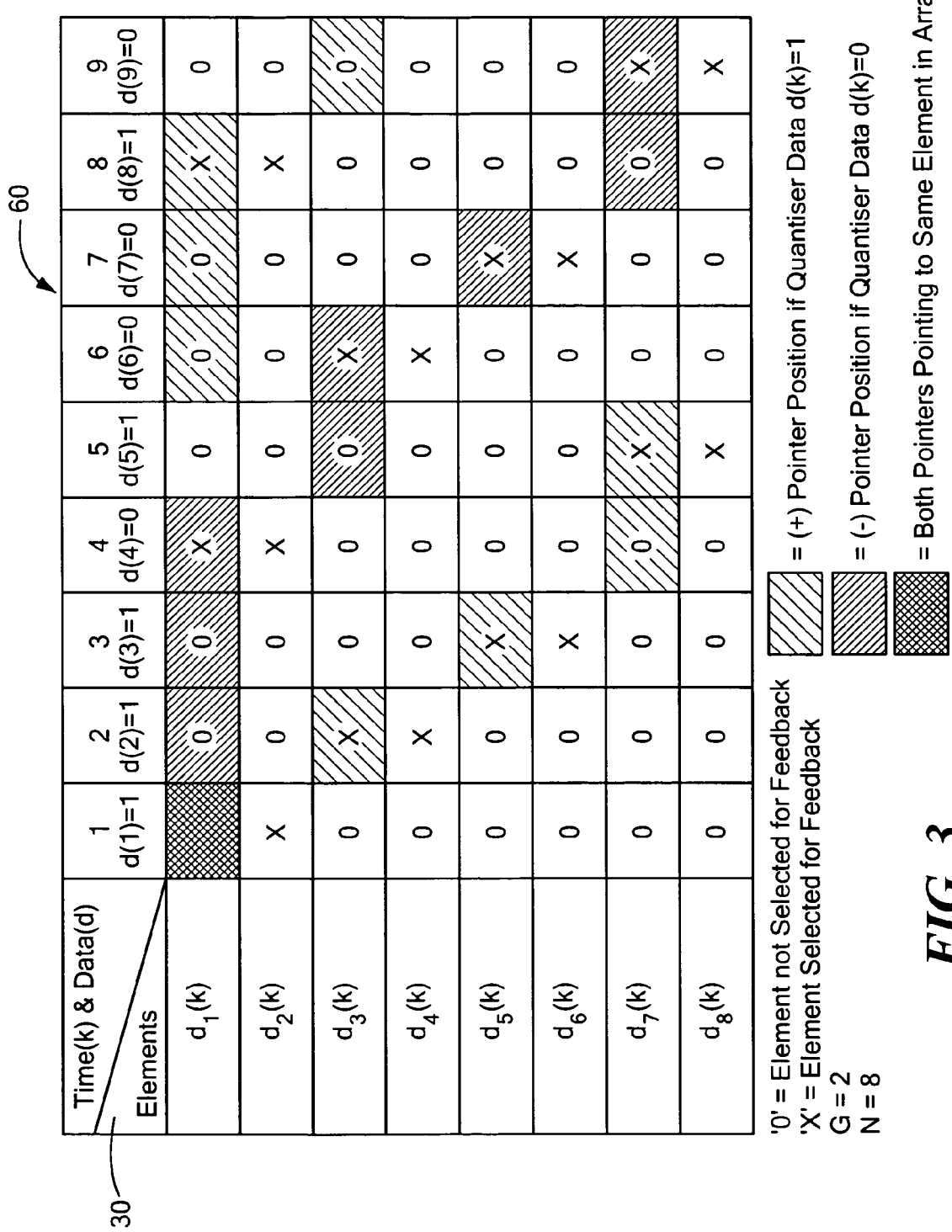
FIG. 3 is a chart illustrating the "round robin" pattern of utilization of the array of gain controlled element according to this invention.

An example of the operation of DEM system 44 is shown with respect to the chart 60, in FIG. 3. Here N is equal to eight and so the left hand column titled, elements, has eight elements 30 in it labeled $d_1(k)$-$d_8(k)$. The chart is constructed for N equal to eight with the gain G equal to two meaning two elements have to be activated for each time period. The top row entitled Time (k) & Data (d) indicates in the top line the time period 1-9 while in the second line there is indicated the data output value from quantizer 18: it is always either a zero or a one. Therefore in time slot one the d(1) equals one; in time slot two d(2) equals one; in time slot three d(3) equals one; in time slot four d(4) equals zero; in time slot five d(5) equals one; in time slot six d(6) equals zero; in time slot seven d(7) equals zero; in time slot eight d(8) equals one; and in time slot nine d(9) equals zero. The body of chart 60 has a zero or a one in each box. An "x" in a box indicates that the element 30 at the left hand of that row has been enabled; a zero means that that element has not been enabled. Finally in chart 60 the brick texture occurring only at the upper most left hand most box indicates an instance where both pointers are pointing to the same element in an array. Throughout the rest of the body of chart 60 there are a few boxes that are cross hatched with lines directed from southwest to northeast and a few boxes which are cross hatched with the lines going from southeast to northwest. The boxes with the cross hatch running from southwest to northeast represent a quantizer output of zero while the boxes with the cross hatch lines running from southeast to northwest represent an output of one from quantizer 18.

An explanation of the dynamic element matching system used in accordance with this invention now follows with respect to chart 60. There in time slot one both pointers as indicated by the brick texture are pointing to element $d_2$. Since the quantizer output at time slot one is one and since the gain G is equal to two the two elements $d_1$ and $d_2$ are enabled, as indicated by the x's. All the rest of the elements in time slot 1, $d_3$-$d_8$ are not enabled as indicated by the zeros. The pointer then for a quantizer value of one is now at $d_3$ in time slot two. Also in time slot two the quantizer 18 output is one, therefore, the next two elements $d_3$ and $d_4$ are enabled as indicated by the x's in those boxes and the rest of the elements $d_1$, $d^2$, $d_5$-$d_8$ are not enabled as indicated by the zeros in those positions. The pointer for quantizer 18 output zero has not moved but has stayed as indicated by the southwest to northeast cross hatch at d1 in time slot two and time slot three. In time slot three quantizer 18 output is again one. Now with the pointer for quantizer output value 1 at $d_5$ the enabled elements will be $d_5$ and $d_6$ as indicated by the x's and the rest of the elements $d_1$-$d_4$, $d_7$, and $d_8$ are all not enabled as indicated by the zeros positioned there. In time slot four the output of quantizer 18 has changed from one to zero, therefore, the enabled elements will be $d_1$ and $d_2$ as indicated by the x's because the pointer was at $d_1$. The pointer for the one value is now at $d_7$ and will remain there in time slot five. In time slot five the output of quantizer 18 has returned to one and so beginning with the pointer at $d_7$ the two elements enabled will be $d_7$ and $d_8$ as indicated by the x's in those boxes and the remaining elements $d_1$ through $d_6$ will not be enabled as indicated by the zeros in those boxes. The pointer for the quantizer output value one with the cross hatching from southeast to northwest is then moved back to element $d_1$ in time slot six. Thus in accordance with this invention the DEM system has used each of the elements equally and is now ready to begin the round robin again, however in time slot six the output of quantizer 18 is zero and so the system looks to the pointer for the zero value with the cross hatch running from southwest to northeast which is found at $d_3$ so $d_3$ and $d_4$ will be the enabled elements as indicated by the x's while elements $d_1$, $d_2$, $d_5$-$d_8$ will not be enabled as indicated by the zeros in those boxes. The pointer for the zero quantizer output cross hatched from southwest to northeast now appears at $d_5$ in time slot seven. In time slot seven the pointer for quantizer output one is still at $d_1$ and since the output of the quantizer is zero it is not to that pointer but to the pointer at $d_5$ that the system turns to enable elements $d_5$ and $d_6$ as indicated by the x's therein, while the remaining elements $d_1$-$d_4$ and $d_7$ and $d_8$ are not enabled as indicated by the zeros therein. In the next time slot, time eight the quantizer 18 output is one and so the pointer indicated by the southeast to northeast cross hatching is where the system turns so that the enabled elements are now $d_1$ and $d_2$ as indicated by the x's therein; the remaining elements $d_3$-$d_8$ are not enabled as indicated by the zeros. The pointer for quantizer output 1 now resides at $d_3$ at time slot nine. In time slot nine the output of quantizer is a zero so the system looks to the pointer for quantizer output zero which is the cross hatching from southwest to northeast. Thus the enabled elements are now $d_7$, $d_8$ while the remaining $d_1$-$d_6$ elements are not enabled as indicated by the zeros in those boxes. At this point the pointers for the quantizer outputs of zero will now move back to $d_1$ in time slot ten, not shown, and so the round robin is completed with respect to the zero outputs as well, illustrating again that the use of the elements has been uniformly distributed. It can be seen then that the use of two pointers provides the benefit that each of the elements will be used equally uniformly even though there are two values available at the output of quantizer 18. That is, if the number of elements in the array is even, then if only one pointer was used the pointer would rest at the next element and as the output of quantizer 18 flip flops back and forth from one to zero and zero to one it would turn out that either the one or zero, would always find the even number elements while the other would find the odd. Thus, each of them would see only 50% of the elements and therefore the averaging would be cut in half thereby reducing the accuracy gained by the distribution of the element application. If the array total is odd, then all elements get selected over an averaging period of say 100 quantizer outputs.

Figure 4:
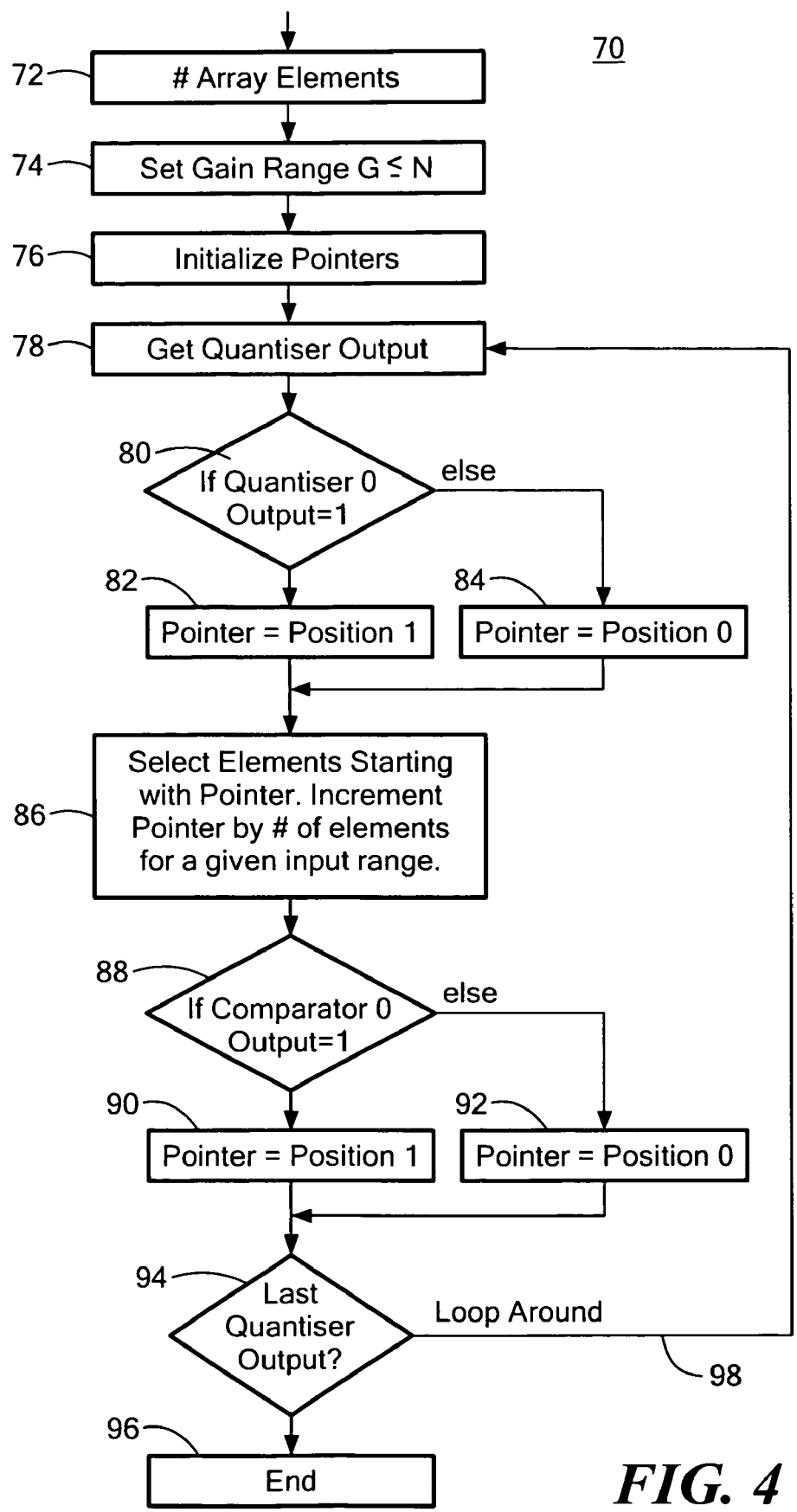
FIG. 4 is a flow chart of one dynamic element matching system which can be used to implement this invention.

A dynamic element matching system, in accordance with this invention, is shown in FIG. 4. The algorithm 70 first looks to determine the number of array elements N, 72; in the examples herein so far N has been equal to 24 and eight. It then sets the gain range 74 where the gain G is equal to or less than N. The pointers are then initialized 76: for example, in the chart of FIG. 3 the initialized pointers are represented by the brick texture in the box in the uppermost left corner. The system then gets the quantizer output 78 from quantizer 18 which is either a one or a zero (or equivalently a plus one or minus one). If the quantizer output at 80 is a one, then the pointer points to a pointer one 82. If it is a zero then the pointer points to a pointer zero 84. The G elements are then selected starting with the pointer 86 and the system increments the pointer by the number of elements for a given input gain range. Also if the count reaches N then the wrap around occurs implementing the round robin. After the G elements have been applied the pointer position is saved. If the quantizer output 88 is a one, then the pointer one is the saved pointer 90. If it is zero then the pointer zero is saved 92 as the pointer. After this the next quantizer output is obtained 94 and the question is asked as to whether it is the last quantizer output. If it is, then the system simply ends operation at 96; if it is not it loops around as shown at 98 and returns again to the get quantizer data step 78.

Figure 5:
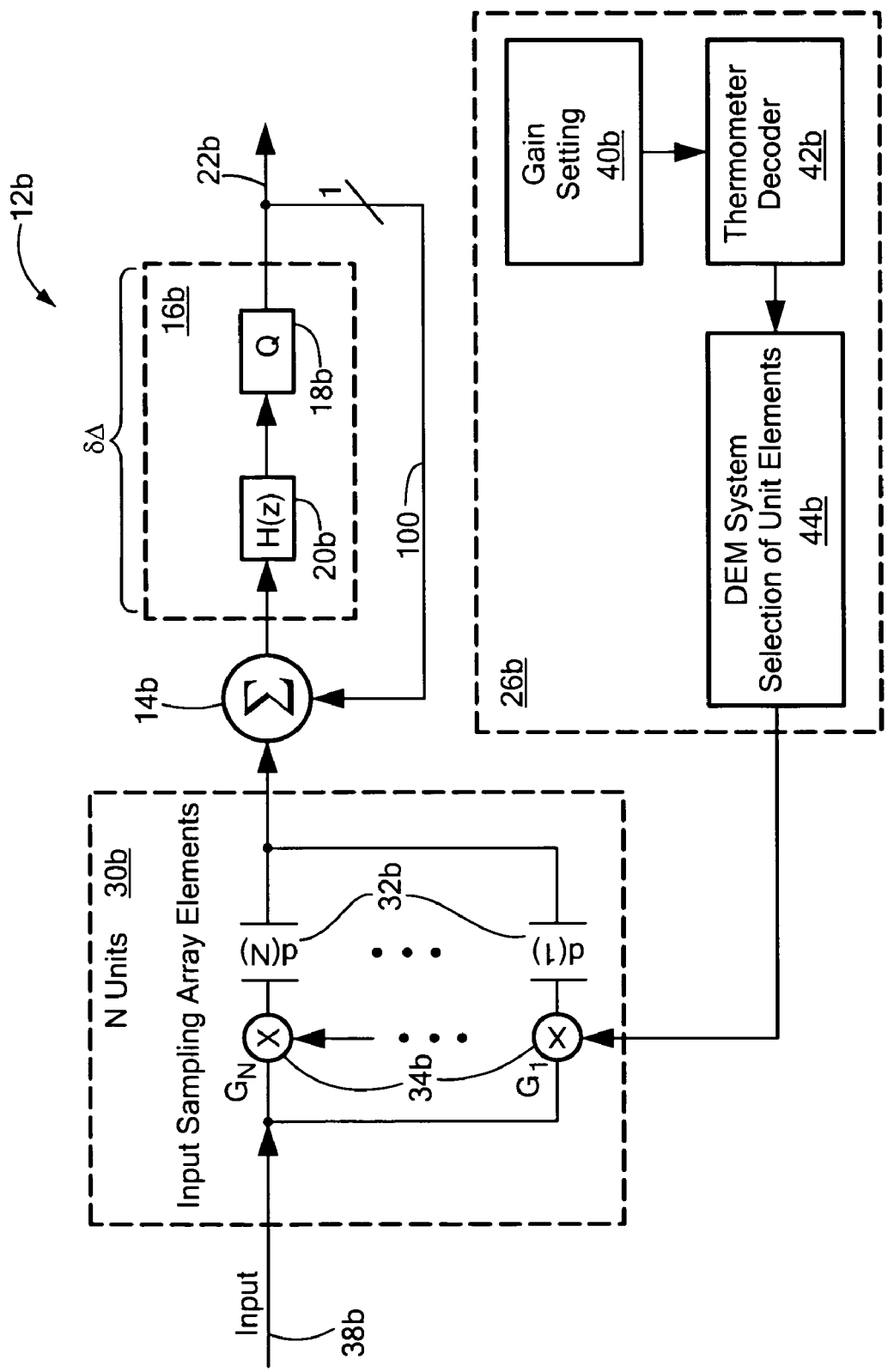
FIG. 5 is a schematic block diagram of a single bit gain ranging analog to digital converter with gain match according to this invention, with the multi-element gain controlled array at the input of the converter.
Figure 6:
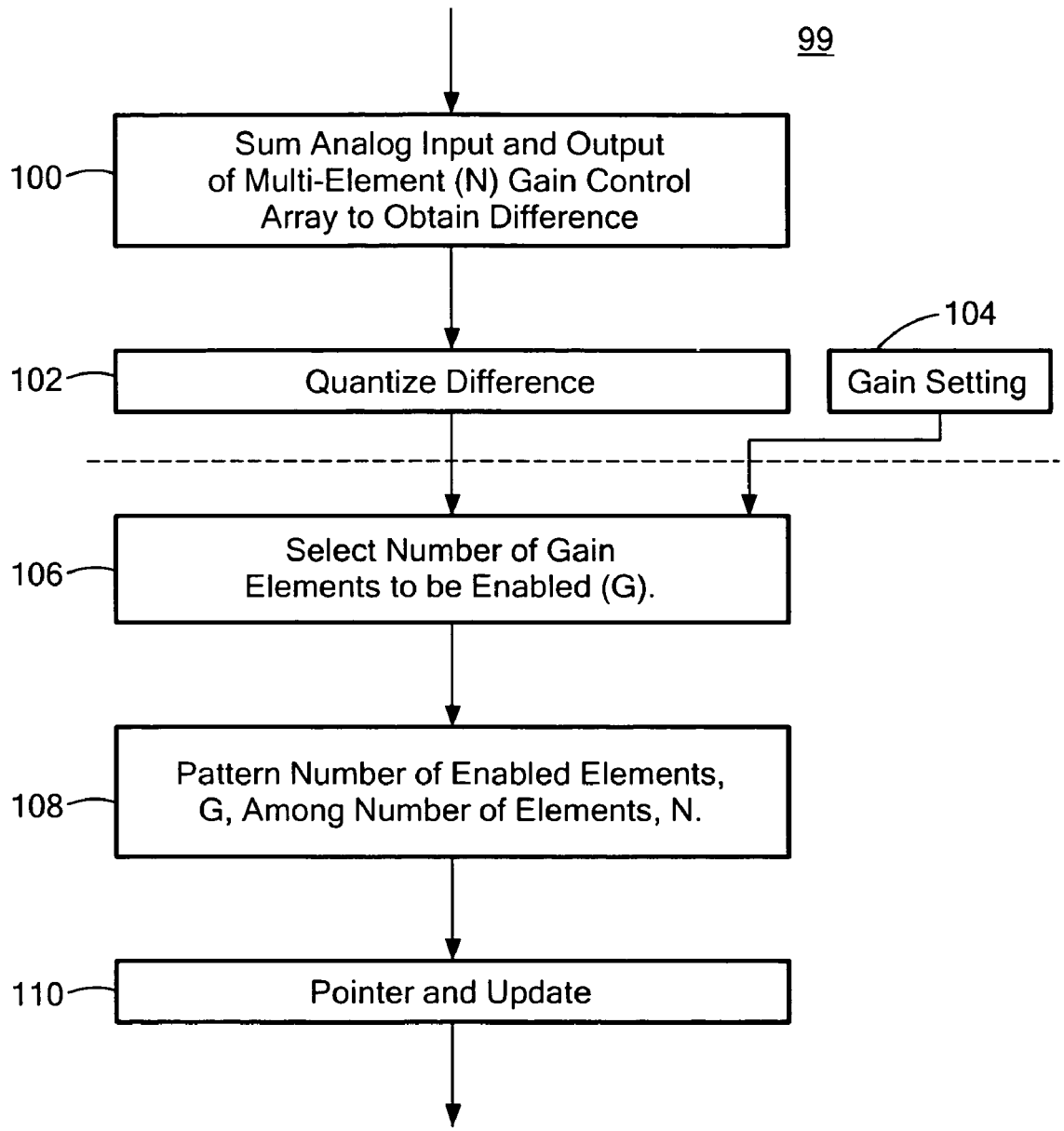
FIG. 6 is a flow chart of the gain matching method of this invention.

While the invention so far has been depicted operating in a feedback environment, that is, multi-element array 30, FIG. 1, is in the feedback loop from the output of the converter at 22 to the input at 14, this is not a necessary limitation of the invention. As shown in FIG. 5, the multi-element array 30b can be placed between the input 38b and the input to a single bit gain ranging analog to digital converter 12b which includes summing circuit 14b and quantizer circuit 16b which includes quantizer 18b and loop filter 20b. Here, however, the feedback loop 100 is simply the feedback loop of converter 12b from the output 22b of quantizer 18b to the summing circuit 14b. Now the mismatch shaping gain circuit 26b including gain setting circuit 40b, decoder 42b, and DEM system 44b independently drives the switches 34b to selectively enable elements 32b independently of any feedback from converter 12b but rather directly as a result of a gain setting 40b.

The invention also includes a gain matching method for a single bit gain ranging analog to digital converter. In a feedback mode the method 99 contemplates summing the analog input and output of a multi-element (N) element gain controlled array to obtain the difference 100. This difference is then quantized 102; that difference is used in combination with a gain setting 104 to select the number of gain elements to be enabled, G, 106. Then a pattern is applied to the number of enabled elements G among the number of elements, N, 108. The pointers are then updated 110 and the method returns to step 100 to sum the analog input and the multi-element gain controlled array output to obtain the difference. The method need not be employed in a feedback mode but may be employed in a direct input mode as shown in FIG. 5 in which case the differencing and quantizing of the difference steps 100 and 102 would not be necessary.

Figure 7:
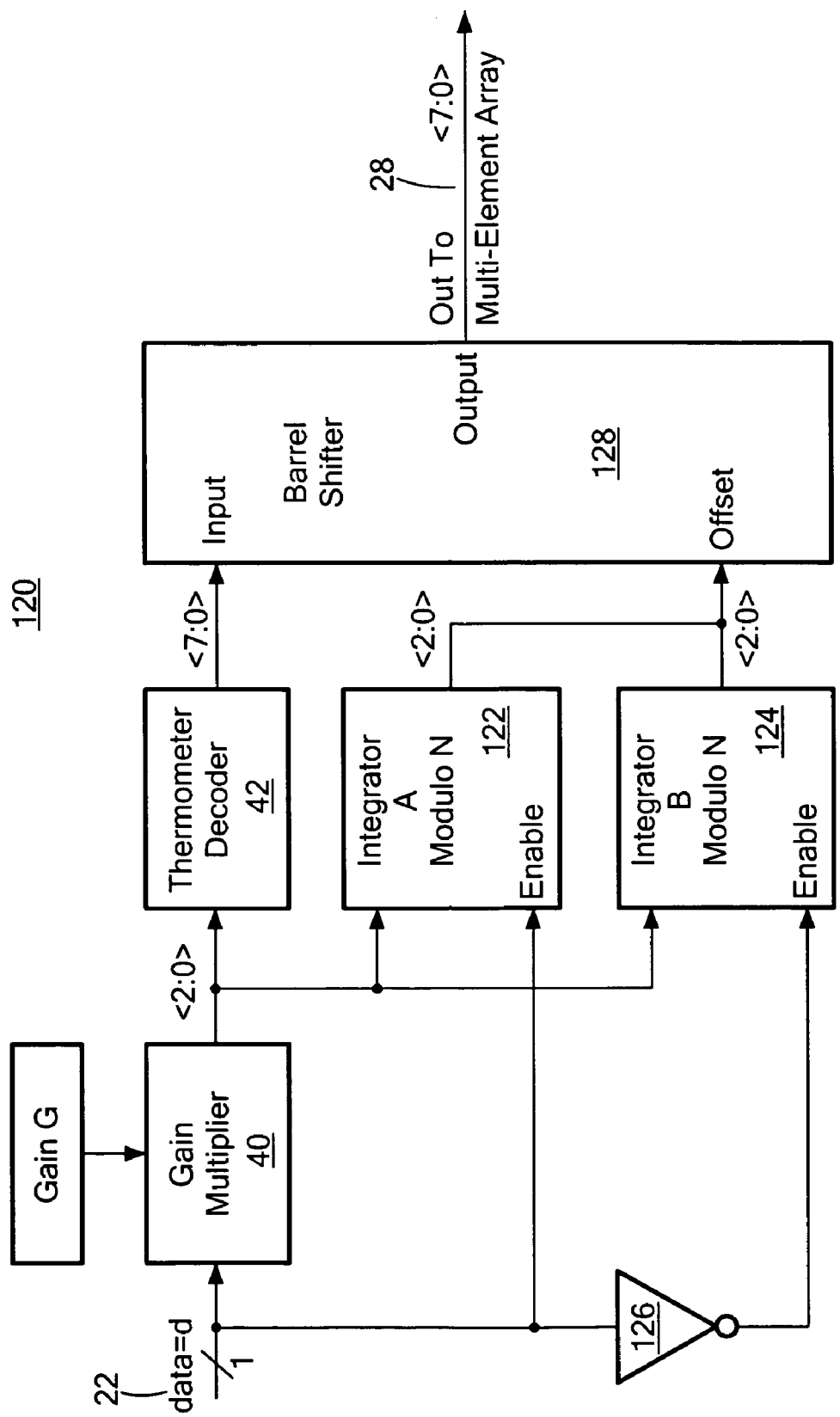
FIG. 7 is a schematic block diagram of a logic circuit for executing the DEM system of FIG. 4.

The DEM system of FIG. 4 can be executed in a logic circuit 120, FIG. 7, using two modulo N integrators 122, 124 (where N is the number of elements), gain multiplier 40, thermometer type decoder 42, 1 bit logic inverter 126, and barrel shifter 128. The number of elements N is assumed to be eight, while the Gain setting G will be assumed to be two. The sequence of time slots and quantizer bit outputs Time (k), Data (d) will be as per chart FIG. 3 illustrating the "round robin" pattern of utilization in the following examples.

The input to DEM system 120 is the output Data (d) of the single bit quantizer 18, which provides only two values, a one or a zero and identifies which of the two modulo N integrators 122 or 124, is selected for the duration of a time period Time (k). The output of logic inverter 126, inverts the quantizer output 18 such that only one of integrator A 122 or integrator B 124 is enabled for a time period Time (k). For example, if quantizer output equals a one, integrator A 122 is enabled, while if quantizer output equals a zero, integrator B 124 is enabled for time period Time (k). Gain multiplier 40, employs the gain setting, G<=N, on line 46 along with quantizer bit on line 22 to provide a gain command to thermometer decoder 42. For example with a gain setting G=2, the 8-bit output of decoder 42 will allow a total of two of N=8 elements to be selected for the duration of an averaging period (prior example 1,000 quantizer outputs).

Modulo N integrators 122, 124, for N=8, are 3-bit counters, which increment by the value of gain setting G during each time slot and save their output values until the next time they are enabled. An integrator is enabled when the logic level at control port Enable is logic 1. Therefore if quantizer output equals a one, integrator A 122 is enabled, while if quantizer output equals a zero, integrator B 124 is enabled for time period Time (k). For simplicity of explanation, it is assumed when the modulus of the integrator output is equal to N, the integrator count is reset to zero. In FIG. 3 time slot five, the value of integrator A 122 is six, and the gain multiplier G equals two, integrator A 122 will count to 6+2, equaling the modulus N=8, thereby resetting its output to a zero, to implement a round robin system. Barrel shifter 128 is a combinational logic circuit with N=8 (8-bit input, 8-bit output) and a 3-bit control signal Offset, set by modulo N integrators 122, 124, that specifies how many places to shift the data between the barrel shifter 128 input and output. The output 28 of barrel shifter 128 is the input to the switches in the N=8 multi-element array. The input to barrel shifter 128 is the 8-bit thermometer decoder output, which is set by the output of the gain multiplier 40.

At the beginning of time slot one, quantizer output is a one and in response to decoder 42 data of "00000011" and initial Offset zero from integrator A 122, the barrel shifter 128 will remain at "00000011", allowing elements d1(k) and d2(k) of the multi-element array to be selected. At the end of time slot one, integrator A 122 will count to 0+2, and so the pointer for the one value with cross hatch running southeast to northwest will reside at element d3(k) of the multi-element array in time for the start of time slot two.

At the beginning of time slot two, quantizer output is a one and in response to decoder 42 data of "00000011" and Offset two from integrator A 122, the barrel shifter 128 will shift data to "00001100", allowing elements d3(k) and d4(k) of the multi-element array to be selected. At the end of time slot two, integrator A 122 will count to 2+2, and so the pointer for the one value with cross hatch running southeast to northwest will reside at element d5(k) of the multi-element array in time for the start of time slot three.

At the beginning of time slot three, quantizer output is again a one and in response to decoder 42 data of "00000011" and Offset four from integrator A 122, the barrel shifter 128 will shift data to "00110000", allowing elements d5(k) and d6(k) of the multi-element array to be selected. At the end of time slot three, integrator A 122 will count to 4+2, and so the pointer for the one value with cross hatch running southeast to northwest will reside at element d7(k) of the multi-element array in time for the start of time slot four.

At the beginning of time slot four, quantizer output is a zero and in response to decoder data 42 of "00000011" and initial Offset zero from integrator B 124, the barrel shifter 128 will remain at "00000011", allowing elements $d1(k)$ and $d2(k)$ of the multi-element array to be selected. At the end of time slot four, integrator B 124 will count to 0+2, and so the pointer for the zero value with cross hatch running southwest to northeast will reside at element $d3(k)$ of the multi-element array in time for the start of time slot five.

At the beginning of time slot five, quantizer output is a one and in response to decoder 42 data of "00000011" and Offset six from integrator A 122, the barrel shifter 128 will shift data to "11000000", to allow elements $d7(k)$ and $d8(k)$ of the multi-element array to be selected. At the end of time slot five, integrator A 122 will count to 6+2, equaling the modulus N=8, thereby resetting its output to zero, to implement a round robin system, allowing the pointer for the one value with cross hatch running southeast to northwest to reside at element $d1(k)$ of the multi-element array in time for the start of time slot six.

At the beginning of time slot six, quantizer output is a zero and in response to decoder 42 data of "00000011" and Offset two from integrator B 124, the barrel shifter 128 will shift data to "00001100", to allow elements $d3(k)$ and $d4(k)$ of the multi-element array to be selected. At the end of time slot six, integrator B 124 will count to 2+2, and so the pointer for the zero value with cross hatch running southwest to northeast will reside at element $d5(k)$ of the multi-element array in time for the start of time slot seven.

At the beginning of time slot seven, quantizer output is again a zero and in response to decoder 42 data of "00000011" and Offset four from integrator B 124, the barrel shifter 128 will shift data to "00110000", to allow elements $d5(k)$ and $d6(k)$ of the multi-element array to be selected. At the end of time slot seven, integrator B 124 will count to 4+2, and so the pointer for the zero value with cross hatch running southwest to northeast will reside at element $d7(k)$ of the multi-element array in time for the start of time slot eight.

At the beginning of time slot eight, quantizer output is a one and in response to decoder 42 data of "00000011" and Offset zero from integrator A 122, the barrel shifter 128 will remain at "00000011", allowing elements $d1(k)$ and $d2(k)$ of the multi-element array to be selected. At the end of time slot eight, integrator A 122 will count to 0+2, and so the pointer for the one value with cross hatch running southeast to northwest will reside at element $d3(k)$ of the multi-element array in time for the start of time slot nine.

At the beginning of time slot nine, quantizer output is a zero and in response to decoder 42 data of "00000011" and Offset six from integrator B 124, the barrel shifter 128 will shift data to "11000000", to allow elements $d7(k)$ and $d8(k)$ of the multi-element array to be selected. At the end of time slot nine, integrator B 124 will count to 6+2, equaling the modulus N=8, thereby resetting its output to zero, to implement a round robin system, allowing the pointer for the pointer for the zero value with cross hatch running southwest to northeast will reside at element $d1(k)$ of the multi-element array in time for the start of time slot ten (not shown).

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A single bit gain ranging analog to digital converter with gain matching system comprising:
   a multi-element gain controlled array including a plurality of gain controlled elements;
   a summing circuit responsive to an analog input and the output of said multi-element gain controlled array for defining a difference signal;
   a quantizer for digitizing the difference signal into a single bit digitized difference signal;
   a gain mismatch shaping circuit responsive to the single bit digitized difference signal and a gain setting for selecting a subset of said gain elements to be enabled based upon the gain setting and assigning a polarity to each of the subset of gain elements based upon the single bit digitized difference signal; and patterning the enablement of the selected subset of gain elements among the gain elements for matching the gain of the analog to digital converter for a range of gain settings of the converter to reduce in-band gain error due to gain element mismatch.

2. The single bit analog to digital converter with gain matching system of claim 1 in which said gain controlled elements are nominally equal.

3. The single bit analog to digital converter with gain matching system of claim 1 in which said gain controlled elements include at least one of capacitors, current sources and resistors.

4. The single bit analog to digital converter with gain matching system of claim 1 in which said quantizer provides a digitized difference signal with both positive and negative values.

5. The single bit analog to digital converter with gain matching system of claim 1 in which said gain mismatch shaping circuit includes a gain multiplier circuit responsive to the digitized difference signal and a gain setting to provide a gain command.

6. The single bit analog to digital converter with gain matching system of claim 5 in which said gain mismatch shaping circuit includes a decoder responsive to said gain command for selecting a number of said gain elements to be enabled.

7. The single bit analog to digital converter with gain matching system of claim 6 in which said gain mismatch shaping circuit includes a dynamic element matching system for patterning the enablement of the selected number of gain elements among all of the gain elements from matching the gain of the analog to digital converter for a range of gain settings of the converter with reduced in-band gain error due to gain element mismatch.

8. The single bit analog to digital converter with gain matching system of claim 6 in which said decoder is a thermometer decoder.

9. The single bit analog to digital converter with gain matching system of claim 1 in which said quantizer includes loop filter for shaping the difference signal.

10. The single bit analog to digital converter with gain matching system of claim 7 in which said dynamic element matching system includes a memory for each quantizer out value.

11. The single bit analog to digital converter with gain matching system of claim 7 in which said dynamic element matching system is configured to set the number of elements in the array; set the gain; initialize the pointer positions for each quantizer output value; get quantizer output; identify and retrieve the pointer positions corresponding to the quantizer output; enable a number of elements corresponding to the set gain and identified by the pointer; incrementing the pointer by the number of elements; and save the pointer positions.

12. A single bit gain ranging analog to digital converter with gain matching system comprising:
a multi-element gain controlled array including a plurality of gain controlled elements interconnected with an analog input and an analog to digital converter, and
a gain mismatch shaping circuit responsive to a single bit digitized difference signal and a gain setting for selecting a subset of said gain elements among the gain elements based upon the gain setting and assigning a polarity to each of the subset of said gain elements based upon the single bit digitized difference signal, the subset of said gain elements are selected for matching the gain of the analog to digital converter for a range of gain settings of the converter to reduce in-band gain error due to gain element mismatch.

13. The single bit gain ranging analog to digital converter with gain matching system of claim 12 in which said gain controlled elements are nominally equally.

14. The single bit gain ranging analog to digital converter with gain matching system of claim 12 in which said gain controlled elements at least one of capacitors, current sources and resistors.

15. The single bit gain ranging analog to digital converter with gain matching system of claim 12 in which said analog to digital converter includes a quantizer that produces an output with two values.

16. The single bit gain ranging analog to digital converter with gain matching system of claim 15 in which said gain mismatch shaping circuit includes a gain setting circuit to provide a gain command.

17. The single bit gain ranging analog to digital converter with gain matching system of claim 16 in which said gain mismatch shaping circuit includes a decoder responsive to said gain command for selecting a number of said gain elements to be enabled.

18. The single bit gain ranging analog to digital converter with gain matching system of claim 17 in which said gain mismatch shaping circuit includes a dynamic element matching system for patterning the enablement of the selected number of gain elements among all of the gain elements for matching the gain of the analog to digital converter for a range of gain settings of the converter with reduced in-band gain error due to gain element mismatch.

19. The single bit gain ranging analog to digital converter with gain matching system of claim 15 in which said quantizer includes an input loop filter for shaping the difference signal.

20. The single bit gain ranging analog to digital converter with gain matching system of claim 18 in which said dynamic element matching system includes a memory for each quantizer output value.

21. The single bit gain ranging analog to digital converter with gain matching system of claim 18 in which said dynamic element matching system is configured to set the number of elements in the array; set the gain; initialize pointer position; enable a number of elements corresponding to the set gain and identified by the pointer; incrementing the pointer by the number of elements; and save the pointer position.

22. A gain matching method for a single bit gain ranging analog to digital converter comprising:
summing an analog input and the output of a multi-element gain controlled array including a plurality of gain controlled elements to obtain a difference signal;
quantizing the difference signal into a single bit digitized difference signal;
selecting, in response to the single bit digitized difference signal and gain setting, a subset of gain elements to be enabled based upon the gain setting and assigning a polarity to each of the subset of gain elements based upon the single bit digitized difference signal; and
patterning the enablement of the selected subset of gain elements among the gain elements for matching the gain of the analog to digital converter for a range of gain settings of the converter to reduce in-band gain error due to gain element mismatch.

23. The gain matching method for a single bit gain ranging analog to digital converter of claim 22 in which patterning includes setting the number of elements in the array; setting the gain; initializing the pointer positions for each quantizer output value; getting quantizer output; identifying and retrieving the pointer position corresponding to the quantizer output; enabling a number of elements corresponding to the set gain and identified by the pointer; incrementing the pointer by the number of elements; and saving the pointer position.

24. A gain matching method for a single bit gain ranging analog to digital converter comprising:
selecting, in response to a gain setting, a subset of gain elements to be enabled in a multi-element gain controlled array interconnected between an analog input and an analog to digital converter;
assigning a polarity to each of the subset of gain elements based upon a single bit digitized difference signal; and
patterning the enablement of the selected number of gain elements among the gain elements for matching the gain of the analog to digital converter for a range of gain settings of the converter to reduce in-band gain error due to gain element mismatch.

25. The gain matching method for a single bit gain ranging analog to digital converter of claim 24 in which patterning includes setting the number of elements in the array; setting the gain; initializing the pointer position; enabling a number of elements corresponding to the set gain and identified by the pointer; incrementing the pointer by the number of elements; and saving the pointer position.

* * * * *